(12) United States Patent
Shizuno

(10) Patent No.: US 7,329,598 B2
(45) Date of Patent: Feb. 12, 2008

(54) METHOD OF MANUFACTURING A SEMICONDUCTOR DEVICE

(75) Inventor: Yoshinori Shizuno, Minato-ku (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/153,824

(22) Filed: Jun. 16, 2005

(65) Prior Publication Data

US 2006/0051900 A1 Mar. 9, 2006

(30) Foreign Application Priority Data

Sep. 9, 2004 (JP) ............................ 2004-262065

(51) Int. Cl.
*H01L 21/44* (2006.01)
(52) U.S. Cl. .................. 438/612; 438/613; 438/690; 438/692; 438/672
(58) Field of Classification Search ............... 438/612, 438/613, 692, 672; 451/78, 38–40
See application file for complete search history.

(56) References Cited

U.S. PATENT DOCUMENTS

| | | | |
|---|---|---|---|
| 5,710,077 A * | 1/1998 | Brehm et al. ............... | 438/472 |
| 6,281,591 B1 * | 8/2001 | Nakamura ................... | 257/778 |
| 6,653,218 B2 * | 11/2003 | Ohuchi et al. ............... | 438/613 |
| 6,732,913 B2 * | 5/2004 | Alvarez ....................... | 228/246 |
| 2001/0045671 A1 * | 11/2001 | Kuroyanagi et al. ........ | 257/788 |
| 2003/0092219 A1 * | 5/2003 | Ohuchi et al. ............... | 438/110 |
| 2003/0121511 A1 * | 7/2003 | Hashimura et al. .......... | 125/2 |
| 2005/0023706 A1 * | 2/2005 | Furuya et al. ............... | 257/786 |

FOREIGN PATENT DOCUMENTS

| | | |
|---|---|---|
| JP | 10-079362 | 3/1998 |
| JP | 2000-216111 | 8/2000 |
| JP | 2000-216185 | 8/2000 |
| JP | 2000-277682 | 10/2000 |
| JP | 2000-294578 | 10/2000 |
| JP | 2000-353766 | 12/2000 |
| JP | 2003-197655 | 7/2003 |

* cited by examiner

*Primary Examiner*—George Fourson
*Assistant Examiner*—John M. Parker
(74) *Attorney, Agent, or Firm*—Volentine & Whitt, P.L.L.C.

(57) ABSTRACT

A method of manufacturing a semiconductor device has: preparing a semiconductor wafer having electrode pads formed on the main surface; forming contact portions, which connect to the electrode pads, on the main surface; forming a sealing resin over the main surface; grinding the top face of the sealing resin for exposing the top faces of the contact portions; polishing the top face of the sealing resin by blast processing for exposing the side of the contact portions; and forming external terminals connected with the contact portions exposing from the sealing resin.

20 Claims, 15 Drawing Sheets

METHOD OF MANUFACTURING A SEMICONDUCTOR DEVICE

BACKGROUND OF THE INVENTION

1. Field of the Invention

The present invention generally relates to a semiconductor device. More specifically, the present invention relates to a chip-size packaged resin-sealed type semiconductor device, and a method of manufacturing thereof.

2. Background Information

In recent years, portable devices represented by notebook PCs, cellular phones, and the like have rapidly become popular, and there are growing demands for much smaller, thinner, and lighter semiconductor devices to be mounted on such portable devices. One key technology that complies with such demands is a high-density packaging technology which includes a CSP (chip size package) and so forth. According to the CSP, the package size can be brought infinitely close to the size of a semiconductor chip. In particular, a W-CSP (wafer level chip size package) is attracting special attention as a technique that realizes an ultimate compact package. In the W-CSP, the molding process is done at a wafer level, and thus the W-CSP is expected to be an effective measure for reducing production costs.

A general structure of a chip-size packaged semiconductor device manufactured by the W-CSP (it is to be referred to as a W-CSP type semiconductor device in the following) includes re-wiring layers connected to electrode pads of a semiconductor chip, contact portions (they can also be called conductor posts) connected to the re-wiring layers, a sealing resin that covers the semiconductor chip at almost the same level with the top surfaces of the contact portions, and electrodes that are formed at the tips of the contact portions. In order to mount a W-CSP type semiconductor device in a mounting substrate, i.e. a printed-circuit board for example, external electrodes of the W-CSP, i.e. spherical electrodes made of solders for example, and connection pads formed on the mounting substrate are joined by melting. In this process, in order to protect the joint parts from possible physical shocks such as falling and vibration, and heat stress that could be caused by temperature difference or the like, a resin, a so called under-fill, is filled up at the interface between the semiconductor device and the mounting substrate.

However, such a method of improving the connection reliability between the semiconductor device and the mounting substrate by filling up the interface with the under-fill requires considerable time for the filling and hardening of the under-fill. This has caused manufacturing costs to increase and productivity to decrease. Taking this into account, various methods have been proposed to improve the connection reliability between the semiconductor device and the mounting substrate without using the under-fill.

For example, inventions that attempted to improve the connection reliability in the chip size package are disclosed in Japanese Patent Application Laid Open No. H10-79362, especially pp. 18-19, FIGS. 19 to 21 (hereinafter reference 1), Japanese Patent Application Laid Open No. 2000-294578, especially pp. 18-19, FIGS. 19 to 21 (hereinafter reference 2), Japanese Patent Application Laid Open No. 2003-197655, especially pp. 18-19, FIGS. 19-21 (hereinafter reference 3), Japanese Patent Application Laid Open No. 2000-216111, especially pp. 3-4, FIG. 2 (hereinafter reference 4), Japanese Patent Application Laid Open No. 2000-216185, especially pp. 4-5, FIGS. 2 and 3 (hereinafter reference 5), Japanese Patent Application Laid Open No. 2000-277682, especially pp. 8-9, FIGS. 1 and 2 (hereinafter reference 6), and Japanese Patent Application Laid Open No. 2000-353766, especially pp. 3-4, FIGS. 1 and 2 (hereinafter reference 7). The aforementioned references are hereby incorporated by reference.

In the semiconductor devices disclosed in the references 1 to 3, a tip part of a projection electrode (equivalent of a contact portion) is exposed from a sealing resin, and this tip part of the exposed projection electrode is connected with a mounting substrate. Since a resin layer that covers the projection electrode is formed during a resin molding process, it is no longer necessary to fill up the under-fill when mounting the semiconductor device on the mounting substrate. Due to this structure, the mounting process can be simplified.

With respect to the semiconductor devices of the references 1 to 3, laser beam processing, etching processing, machine polishing, blast processing, etc. are indicated as a means to expose the tip part of the projection electrode from the sealing resin.

In the semiconductor device introduced in the reference 4, a three-layer film constructed from a nickel plating, a palladium plating, and a gold plating is formed on a top surface of a contact portion. Thereby, junction strength between the contact portion and an external electrode, i.e. a spherical electrode made of solder for example, can be increased.

With respect to the semiconductor device of the reference 4, the sealing resin is formed using a known compression molding method. More specifically, the surface of the semiconductor device is pressed by a metal mold where a sealing film, i.e. a sealing resin, is arranged, and thereby it is sealed with the sealing resin. At this time, the surface of the contact portion is made to be exposed from a sealing resin by having a tip part of the contact portion sunk into the sealing film.

In the semiconductor device introduced in the reference 5, a three-layer film constructed from a nickel plating, a palladium plating, and a solder plating is formed on a top surface of a contact portion. Thereby, junction strength between the contact portion and an external electrode, i.e. a spherical electrode made of solder for example, can be increased.

Moreover, in the semiconductor device introduced in the reference 5, the edge of the solder plating protrudes from the outer surface of the sealing resin, and the interface between the solder plating and a foundation layer is in the inner side from the outer surface of the solder plating. Thereby, a connection part between the contact portion and the spherical electrode can be supported inside a concave structure formed by an inner wall surface of the sealing resin and the nickel plating, which contributes to improving durability of the external electrode.

With respect to the semiconductor device of the reference 5, the sealing resin is formed using a known compression molding method. More specifically, the surface of the semiconductor device is pressed by a metal mold where a sealing film, i.e. the sealing resin, is arranged, and thereby it is sealed with the sealing resin. At this time, the surface of the contact portion is made to be exposed from a sealing resin by having a tip part of the contact portion sunk into the sealing film.

The semiconductor device as introduced in the reference 6 has a double-sided symmetrical structure that is constructed from two semiconductor chips joined at their back side, by which it is made possible to prevent the semiconductor device from being curved due to possible difference between thermal expansion rates of a sealing resin and a semiconductor chip. By this structure, possible curvature of the whole semiconductor device is reduced, and the connection reliability between the semiconductor device and a mounting substrate can be improved.

With respect to the semiconductor device of the reference 6, a sealing resin is formed using the known compression molding method. More specifically, the surface of the semiconductor device is pressed by a meal mold where a sealing film, i.e. the sealing resin, is arranged, and thereby it is sealed with the sealing resin. At this time, the surface of a contact portion is made to be exposed from a sealing resin by having a tip part of the contact portion sunk into the sealing film.

In the semiconductor device indicated in the reference 7, a groove is formed by laser irradiation in a sealing resin surrounding a contact portion, and thereby a spherical electrode made of solder is bonded with a top surface and parts of the sides of the contact portion. By this structure, the junction strength between the contact portion and the spherical electrode can be increased, and the connection reliability between the semiconductor device and a mounting substrate can be improved. Moreover, according to the disclosure of the reference 7, the surface of the contact portion is once exposed by grinding the sealing resin before conducting a laser beam machining.

As described above, various methods have been proposed to improve the connection reliability with respect to a chip size package. However, each of the above-described methods has some problems that will be described in the following.

With respect to the references 1 to 3, the surface of the sealing resin is processed by laser beam processing, etching processing, machine polishing, blast processing, etc. in order to expose the tip of the projection electrode. However, when performing a laser beam machining, etching processing, and blast processing from the state completely covered with the sealing resin, the processing time will become longer. Moreover, although the processing time can be shortened if machine polishing is performed, it is difficult to expose the tip of the projection electrode from the sealing resin with sufficient accuracy by only the machine polishing.

According to the reference 4, a three-layer film constructed from a nickel plating, a palladium plating, and a gold plating is formed at the top surface of the contact portion in order to increase the junction strength between the contact portion and the external electrode. However, the contact portion constructed from copper plating is as thick as 100 μm, and it is supposed that there are considerable individual differences in the heights of the contact portions. Accordingly, variation may be produced in the final height also including the external electrodes formed on the contact portions, and this may cause unevenness in the height of the connection part of the semiconductor device and the mounting substrate. Therefore, stress concentrates locally in the connection part between the semiconductor device and the mounding substrate, and there is a possibility of inducing destruction in the connection part.

According to the reference 5, a three-layer film constructed from a nickel plating, a palladium plating, and a solder plating is formed at the top surface of the contact portion in order to increase the junction strength between the contact portion and the external electrode. However, as with the case of the reference 4, the contact portion formed by copper plating is as thick as 100 μm, and it is supposed that there are considerable individual differences in the heights of the contact portions. Accordingly, variation may be produced in the final height also including the external electrodes formed on the contact portions, and this may cause unevenness in the height of the connection part of the semiconductor device and the mounting substrate. Therefore, stress concentrates locally in the connection part between the semiconductor device and the mounting substrate, and there is a possibility of inducing destruction in the connection part.

Furthermore, according to the reference 5, the connection part between the contact portion and the spherical electrode is made to be supported inside the concave structure formed by the inner wall surface of the sealing resin and the nickel plating, which contributes to improving the durability of the external electrode. This structure may effectively work against some stresses such as heat stress, which is gradually added comparatively. However, this structure does not effectively work against impact stresses such as falling and vibrations, the forces of which are added instantaneously.

According to the reference 6, as with the cases of the references 4 and 5, it is supposed that there are considerable individual differences in the heights of the contact portions. Accordingly, variation may be produced in the final height also including the external electrodes formed on the contact portions, and this may cause unevenness in the height of the connection part of the semiconductor device and the mounting substrate. Therefore, stress concentrates locally in connection part between the semiconductor device and the mounting substrate, and there is a possibility of inducing destruction in the connection part.

According to the reference 7, a groove is formed in the sealing resin surrounding the contact portion, and thereby the spherical electrode made of solder is made to bond with the top surface and parts of the sides of the contact portion. By this structure, the junction strength between the contact portion and the spherical electrode can be increased. However, since the groove is formed by laser irradiation, the processing will take time. Therefore, if a semiconductor device has a multi-pin structure, the method of reference 7 will not be effective or practical enough in terms of manufacturing costs and time.

In view of the above, it will be apparent to those skilled in the art from this disclosure that there exists a need for an improved method of manufacturing a semiconductor device. This invention addresses this need in the art as well as other needs, which will become apparent to those skilled in the art from this disclosure.

SUMMARY OF THE INVENTION

It is therefore an object of the present invention to resolve the above-described problems, and to provide a method of manufacturing a semiconductor device which is suitable for manufacturing a semiconductor device for which MOS type semiconductor elements having gate insulting films with different film thicknesses are formed on the same semiconductor substrate.

In accordance with a first aspect of the present invention, a method of manufacturing a semiconductor device includes preparing a semiconductor wafer having electrode pads formed on the main surface; forming contact portions, which connect to the electrode pads, on the main surface; forming a sealing resin over the main surface; grinding the top face of the sealing resin to expose the top faces of the contact portions; polishing the top face of the sealing resin by blast processing to expose the side of the contact portions; and forming external terminals connected with the contact portions exposing from the sealing resin.

These and other objects, features, aspects, and advantages of the present invention will become apparent to those skilled in the art from the following detailed description, which, taken in conjunction with the annexed drawings, discloses preferred embodiments of the present invention.

BRIEF DESCRIPTION OF THE DRAWINGS

Referring now to the attached drawings which form a part of this original disclosure.

DETAILED DESCRIPTION OF THE PREFERRED EMBODIMENTS

Figure 1:
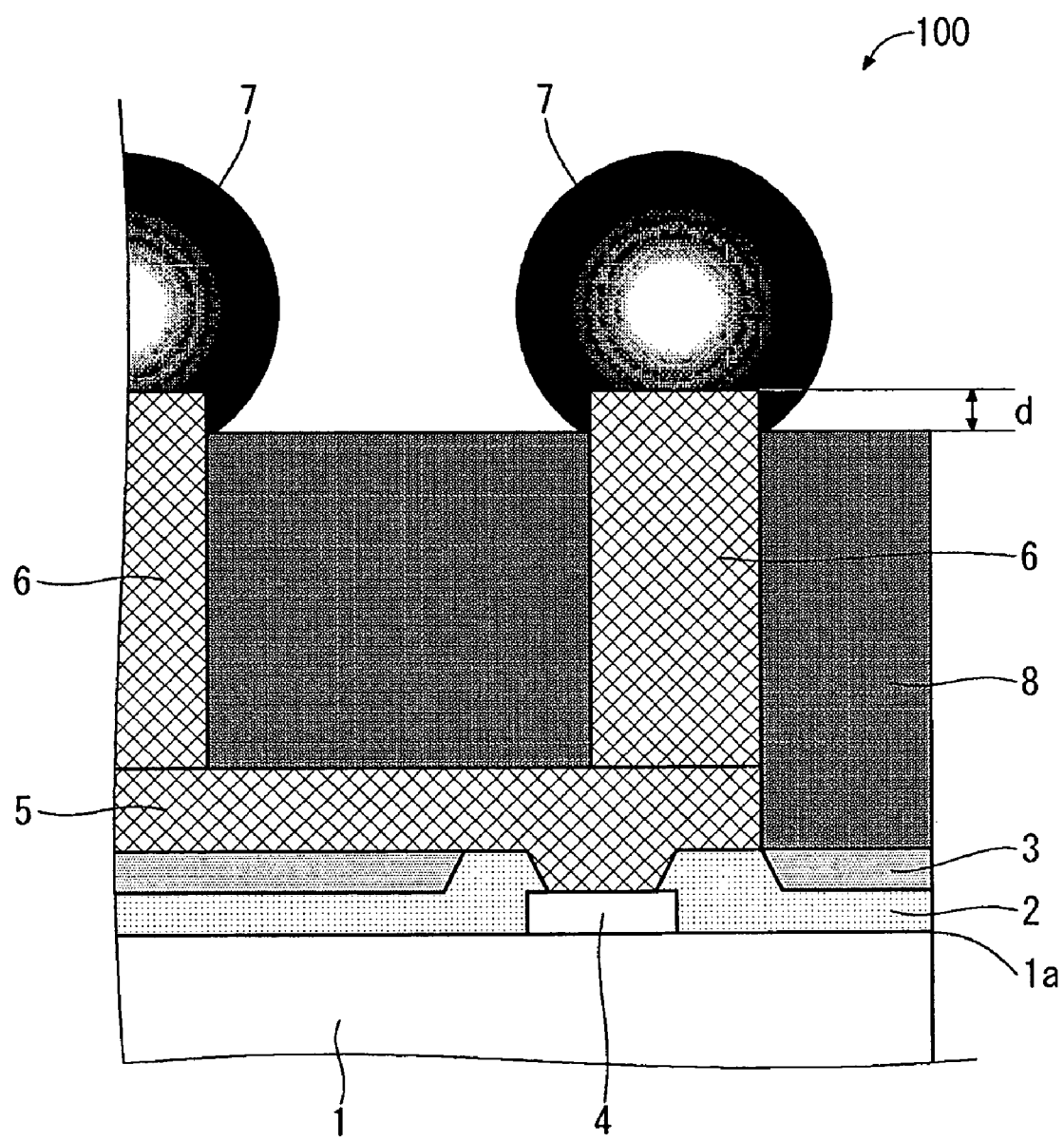
FIG. 1 is a cross-sectional diagram material view of a part of a structure of a resin-sealed type semiconductor device according to a first preferred embodiment of the present invention.

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

Referring now to the drawings, preferred embodiments of the present invention will be described in detail.

(1) First Embodiment

Structure

FIG. 1 is a view of a cross-sectional diagram of a part of a structure of a resin-sealed type semiconductor device 100 according to a first preferred embodiment of the present invention. The resin-sealed type semiconductor device 100 has a semiconductor chip 1, protective films 2 and 3, electrode pads 4, re-wiring layers 5, contact portions (i.e. conductor posts) 6, spherical electrodes (i.e. external terminals) 7, and a sealing resin 8.

The semiconductor chip 1 has the protective film 2 and the electrode pads 4 arranged on the side or top of an element formation surface (main surface) 1a. The semiconductor chip 1 has the electrode circuitry. In other words, on the element formation surface 1a, an electrode circuitry (not shown) having one or more semiconductor elements such as a transistor is formed. The protective film 2 is a passivation coating to protect the semiconductor chip 1 from possible mechanical stress and entering impurities. The protective film 2 is, for example, a silicon oxide film ($SiO_2$), a silicon nitride film ($Si_3N_4$), or the like. The electrode pads 4 are provided to exchange electric signals between the semiconductor chip 1 and the exterior, and is electrically connected with the semiconductor elements (not shown) that are formed on the element formation surface 1a.

The protective films 3 are formed on the semiconductor chip 1 except for over the upper parts of the electrode pads 4. The protective films 3 are, for example, polyimide resin films. The re-wiring layers 5 are formed on the protective films 3, and are respectively electrically connected with the electrode pads 4. The contact portions 6 respectively connect the re-wiring layers 5 and the spherical electrodes 7. For example, the re-wiring layer 5 and the contact portion 6 can be made of metal such as Cu (copper) and Al (aluminum). The spherical electrodes 7 are formed on the contact portions 6, and they serve as terminals to connect the resin-sealed type semiconductor device 100 to an external apparatus such as a printed circuit board or the like. Generally, the spherical electrodes 7 are made of solder.

The sealing resin 8 seals the protective films 3, the re-wiring layers 5, and the contact portions 6. The sealing resin 8 is, for example, a thermosetting resin such as an epoxy resin. In this resin-sealed type semiconductor device 100, the contact portion 6 is about 80 to 90 μm high, and the diameter thereof is about 250 μm. Moreover, in order to expose the top faces and parts of the sides of the contact portions 6, the sealing resin 8 is formed having a film thickness the top of which is lower than the top faces of the contact portions 6 by a predetermined amount 'd'. This predetermined amount 'd', for example, can be 10 μm or so. The spherical electrodes 7 are formed such that they respectively connect with the top faces and parts of the sides of the contact portions 6 that are exposed from the sealing resin 8.

Manufacturing Method

Next, a manufacturing method of the resin-sealed type semiconductor device 100 according to the first embodiment of the present invention will be described.

FIGS. 2A to 3E are cross-sectional views illustrating the manufacturing processes of the resin-sealed type semiconductor device 100 in a simple manner. In this particular embodiment, the method of manufacturing the resin-sealed type semiconductor device 100 uses the technique of W-CSP (Wafer-level Chip Size Package). According to the W-CSP technique, a sealing process is done at a wafer level. Accordingly, the processes as shown in FIGS. 2A to 3C are done at a wafer level.

Figure 2A:
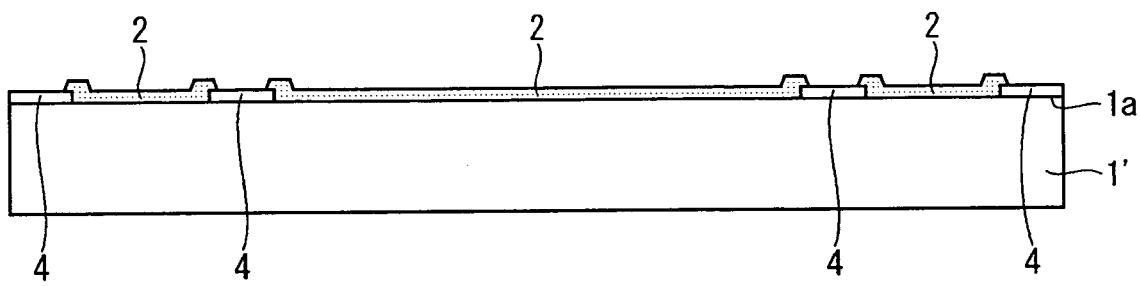
FIGS. 2A to 3E are cross-sectional views illustrating manufacturing processes of the resin-sealed type semiconductor device according to the first embodiment of the present invention in a simple manner.

First, as shown in FIG. 2A, a semiconductor wafer 1' whose electrical property has been estimated by wafer inspection is prepared. The semiconductor wafer 1' has the protective film 2 and the electrode pads 4 formed on a top side of the element formation surface 1a. On the element formation surface 1a, electronic circuitry (not shown) is constituted by semiconductor elements such as a transistor, and the electrode pads 4 are electrically connected to those semiconductor elements. The protective film 2 is formed on the semiconductor wafer 1' except for the upper parts of the electrode pads 4. Generally, the protective film 2 is a silicone oxide film ($SiO_2$), but it can also be a silicone nitride film ($Si_3N_4$).

Figure 2B:
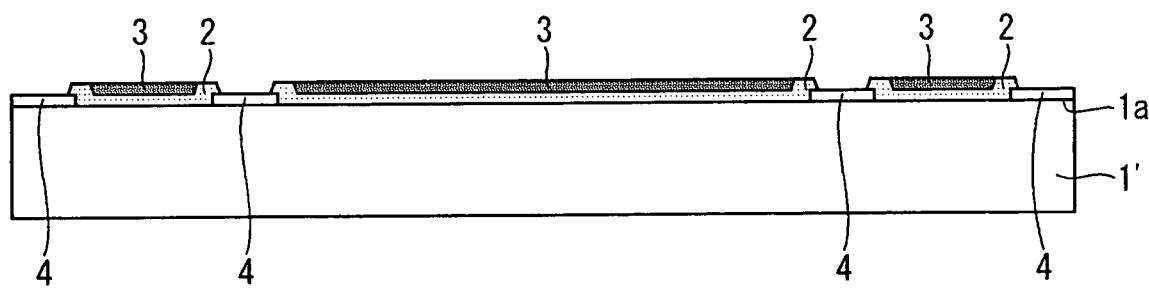

Next, as shown in FIG. 2B, a polyimide resin is applied over the whole surface of the semiconductor wafer 1', and the protective film 3 is formed to cover the semiconductor water 1' except for the upper parts of the electrode pads 4 by photolithography and etching.

Figure 2C:
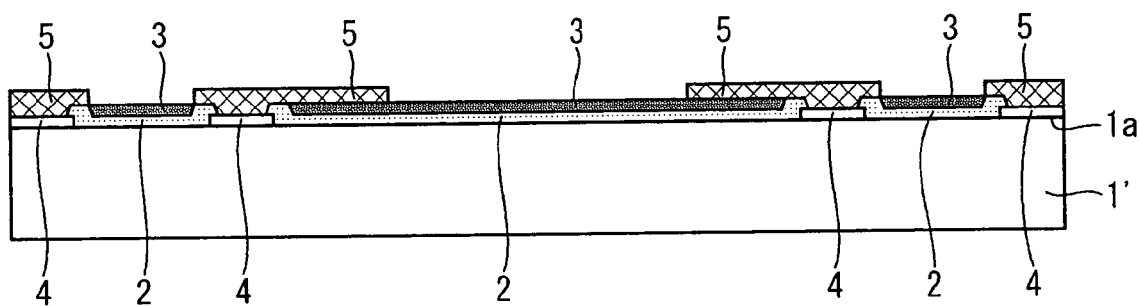

Next, as shown in FIG. 2C, Cu is deposited on the whole surface of the semiconductor wafer 1' by sputtering, and through photolithography and etching, the re-wiring layers 5 are formed. The re-wiring layers 5 are formed so that they connect with the electrode pads 4. As for the material of the re-wiring layer 5, it is also possible to use Al or the like instead of Cu.

Figure 2D:
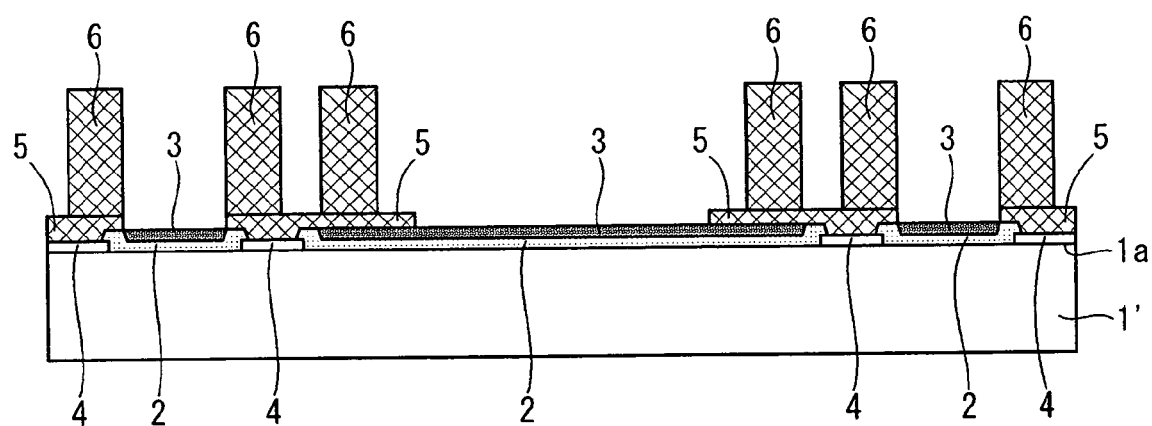

Next, as shown in FIG. 2D, the contact portions 6 made of Cu are made at parts of the re-wiring layers 5 by electroplating. The height and diameter of the contact portion 6 are respectively, for example, 100 μm and 250 μm. In the plating process, for instance, a resist medium is applied over the whole surface of the semiconductor wafer 1', and through processes of exposure and development, a resist having apertures which expose parts of the re-wiring layers 5 is formed. Then, through the process of soaking the semiconductor wafer 1' in a coating liquid including Cu, the apertures are filled up with the coating liquid. After the coating liquid is harden, the resist is removed so that the contact portions 6 are formed respectively on the re-wiring layers 5. As for the material of the contact portion 6, it is also possible to use Al or the like instead of Cu.

Figure 3A:
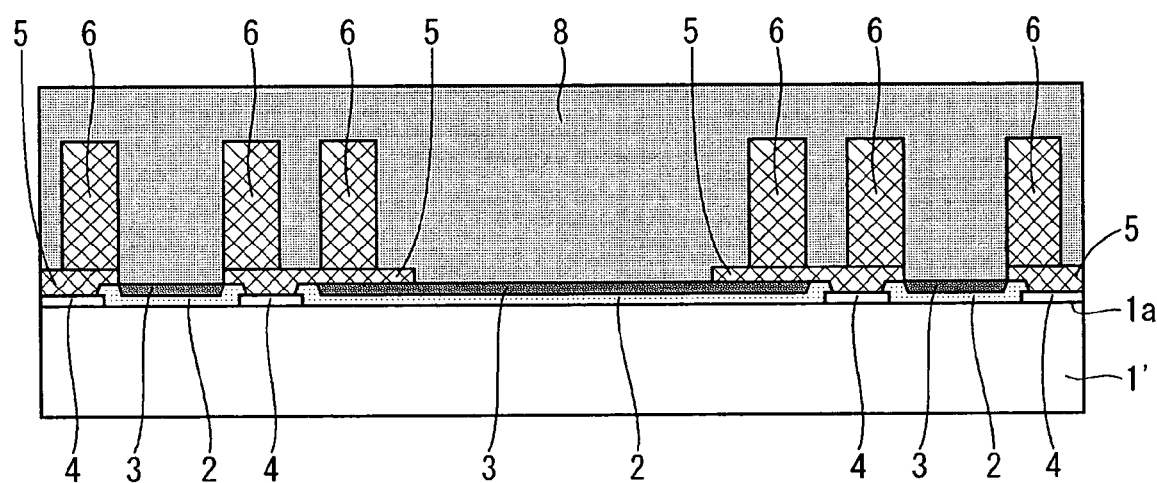

Next, as shown in FIG. 3A, the protective film 3, the re-wiring layers 5, and the contact portions 6 are sealed by the sealing resin 8. Here, the sealing resin 8 can be, for example, an epoxy resin or the like. At this time, in order to cover entirely the contact portions 6, the sealing resin 8 is formed to the thickness that surpasses the height of the conductor portions 6. For instance, if the contact portion 6 is formed to be 100 μm high, the sealing resin 8 should be thicker than 100 μm.

Figure 3B:
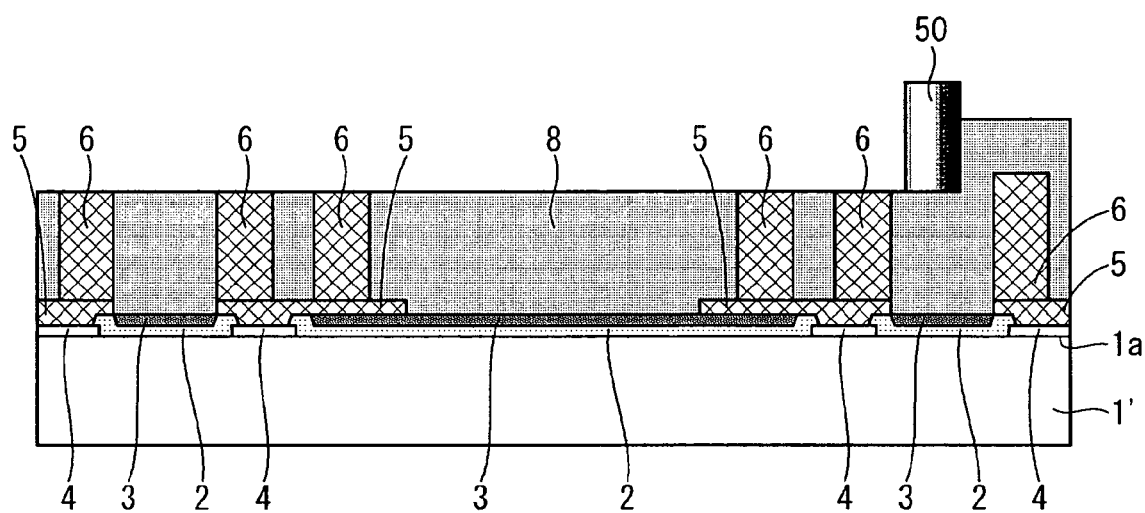

Next, as shown in FIG. 3B, the top face of the sealing resin 8 is grinded. In this process, for example, the top face of the sealing resin 8 is grinded by a grind stone 50. Consequently, the top faces of the contact portions 6 are exposed. In this grinding process, the contact portions 6 are processed so that the heights thereof are uniform, while the top faces of the contact portions 6 and the sealing resin 8 are made flat. In addition, in this grinding process, in the case in which the contact portion 6 was 100 μm high in the beginning, the height of the contact portion 6 may be lowered to about 80 to 90 μm. Thus, the tops and parts of the adjacent sides perpendicular or substantially perpendicular to tops of the contact portions 6 are exposed.

Figure 3C:
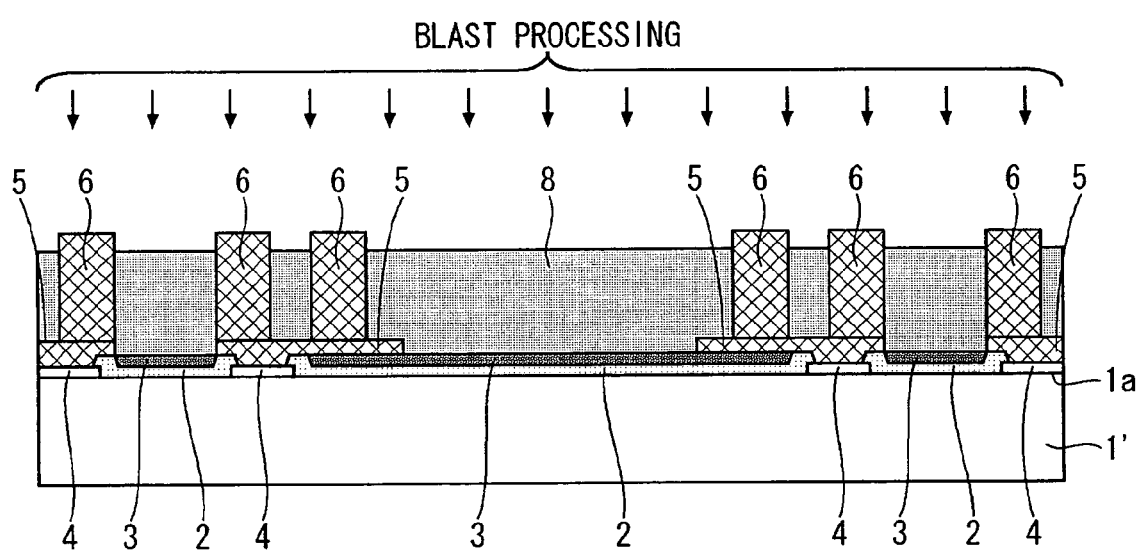

Next, as shown in FIG. 3C, blast processing is performed on the top faces of the contact portions 6 and the sealing resin 8. In this embodiment, a liquid honing method is used for the blast processing. In this liquid honing method, a liquid mixture of abrasive grains and water (slurry) is ejected from a nozzle together with compressed air to a target, by which the target is physically polished. With the liquid honing method, it is possible to process a wide range of area at one time and finish the processing top faces evenly and uniformly. Therefore, the liquid honing method is considered as an optimal polishing method for surface processing.

As for the conditions of the liquid honing process in this particular embodiment, polygonal particles of alumina ($Al_2O_3$) are used as the abrasive grains, and the process is performed twice with an air pressure of 0.25 MPa at a processing speed of 10 mm/sec. In such surface polishing using the liquid honing method, the polishing rate of the contact portion 6, for which metal is being used as the material, is far faster than the polishing rate of the sealing resin 8, for which an epoxy resin or the like is being used as the material. Therefore, the sides of the contact portions 6 can be efficiently exposed.

In this particular embodiment, by applying the surface polishing using the liquid honing method, the upper parts of the contact portions 6 are made to be exposed by about 10 μm from the sealing resin 8. In addition, the blast processing is not restricted to the liquid honing method as long as it is a method that can efficiently expose the sides of the contact portions 6 from the sealing resin 8. Therefore, there are no particular restrictions on the dry type, heating type, and hydraulic type.

Figure 3D:
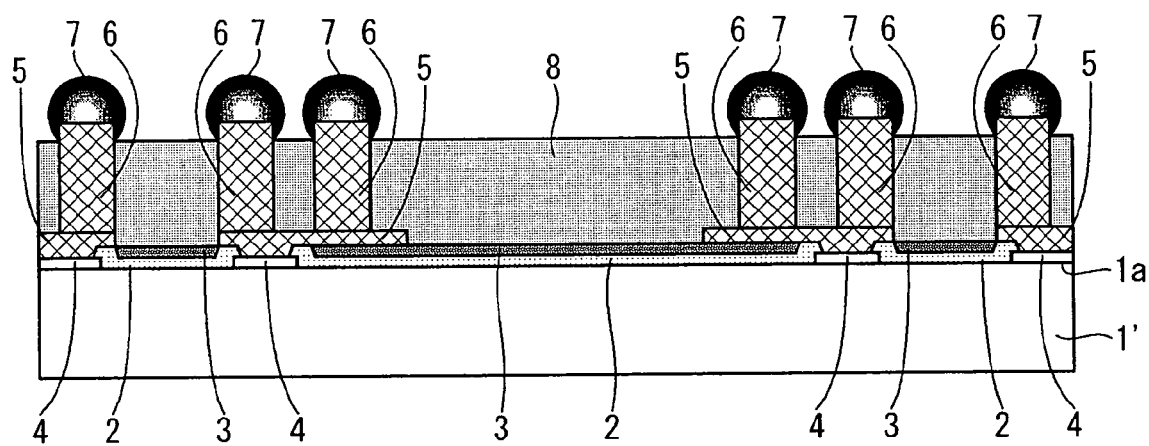

Next, as shown in FIG. 3D, the spherical electrodes 7 made of solders are formed on the contact portions 6. The spherical electrodes 7 are, for example, formed by ball mounting. More specifically, the bulk of solder balls are mounted on the contact portions 6 mechanically by a ball mounter, and continuously reflowed. Thereby, the spherical electrodes 7 are formed. The spherical electrodes 7 are formed so that they may be attached to the top faces and parts of the sides of the contact portions 6 that are exposed from the sealing resin 8. Accordingly, joints between the contact portions 6 and the spherical electrodes 7 are strengthened, and the shockproof ability improves.

Figure 3E:
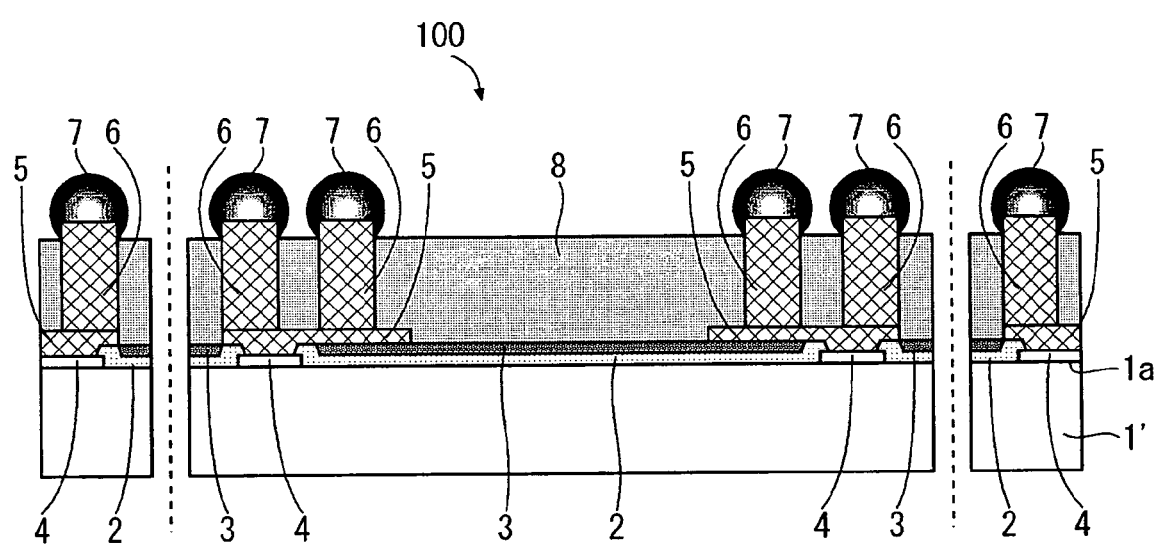

Finally, as shown in FIG. 3E, the semiconductor wafer 1' is divided into pieces by a dicing cutter such as a diamond cutter or the like, and the formation of the resin-sealed type semiconductor device 100 is completed.

In addition, although the present embodiment has been described as a resin-sealed type semiconductor device 100 of a BGA (ball grid array) type, as long as it is a semiconductor device with a structure having contact portions formed on a semiconductor chip and covered with a sealing resin, and for which external electrodes are formed on the contact portions, the present invention can be applied.

Operation Effect

According to the manufacturing method of a semiconductor device with respect to the first embodiment of the present invention, the spherical electrodes 7 are formed with respect to the contact portions 6 whose top faces and parts of the sides are exposed. By such an arrangement, the spherical electrodes 7 can be supported by the top faces and the sides of the contact portions 6, thereby, connection parts between the contact portions 6 and the spherical electrodes 7 can be strengthened, and the shockproof ability can be improved. This provides improvement on the connection reliability between the resin-sealed type semiconductor device 100 and the mounting substrate.

Furthermore, according to the present embodiment, the process of exposing the top faces of the contact portions 6 by grinding is conducted before the process of exposing the parts of the sides of the contact portions 6. By this arrangement, the contact portions 6 are processed so that the heights thereof are uniform, while the top faces of the contact portions 6 and the sealing resin 8 are made flat. Therefore, the final heights including the spherical electrodes 7 formed on the contact portions 6 becomes even, and thus, possible local stress concentration at the contact parts between the resin-sealed type semiconductor device 100 and the mounting substrate may hardly occur. This provides improvement on the connection reliability between the resin-sealed type semiconductor device 100 and the mounting substrate.

Furthermore, according to the present embodiment, by using the blast method i.e., a liquid honing method for example, for the exposing process for the sides of the conductor portions 6, it becomes possible to conduct the exposing process at a wafer level, and thereby the exposing process may be simplified. Therefore, as compared with the cases where the exposing processes are done by laser or the like, it is possible to shorten the processing time and to reduce the production cost as well.

Moreover, according to the present embodiment, by implementing the exposing process of the contact portions 6 in two steps, i.e. by the grinding process and the polishing process by blast processing, the processing time can be shortened when compared to a case in which the entire exposing process is done by blast processing alone.

As used herein, the following directional terms "forward, rearward, above, downward, vertical, horizontal, below, and transverse" as well as any other similar directional terms refer to those directions of a device equipped with the present invention. Accordingly, these terms, as utilized to describe the present invention, should be interpreted relative to a device equipped with the present invention.

SECOND EMBODIMENT

A second embodiment will now be explained. In view of the similarity between the first and second embodiments, the parts of the second embodiment that are identical to the parts of the first embodiment will be given the same reference numerals as the parts of the first embodiment. Moreover, the descriptions of the parts of the second embodiment that are identical to the parts of the first embodiment may be omitted for the sake of brevity.

(2) Second Embodiment

Structure

Next, a structure of a resin-sealed type semiconductor device 101 according to a second embodiment of the present invention will be explained.

Figure 4:
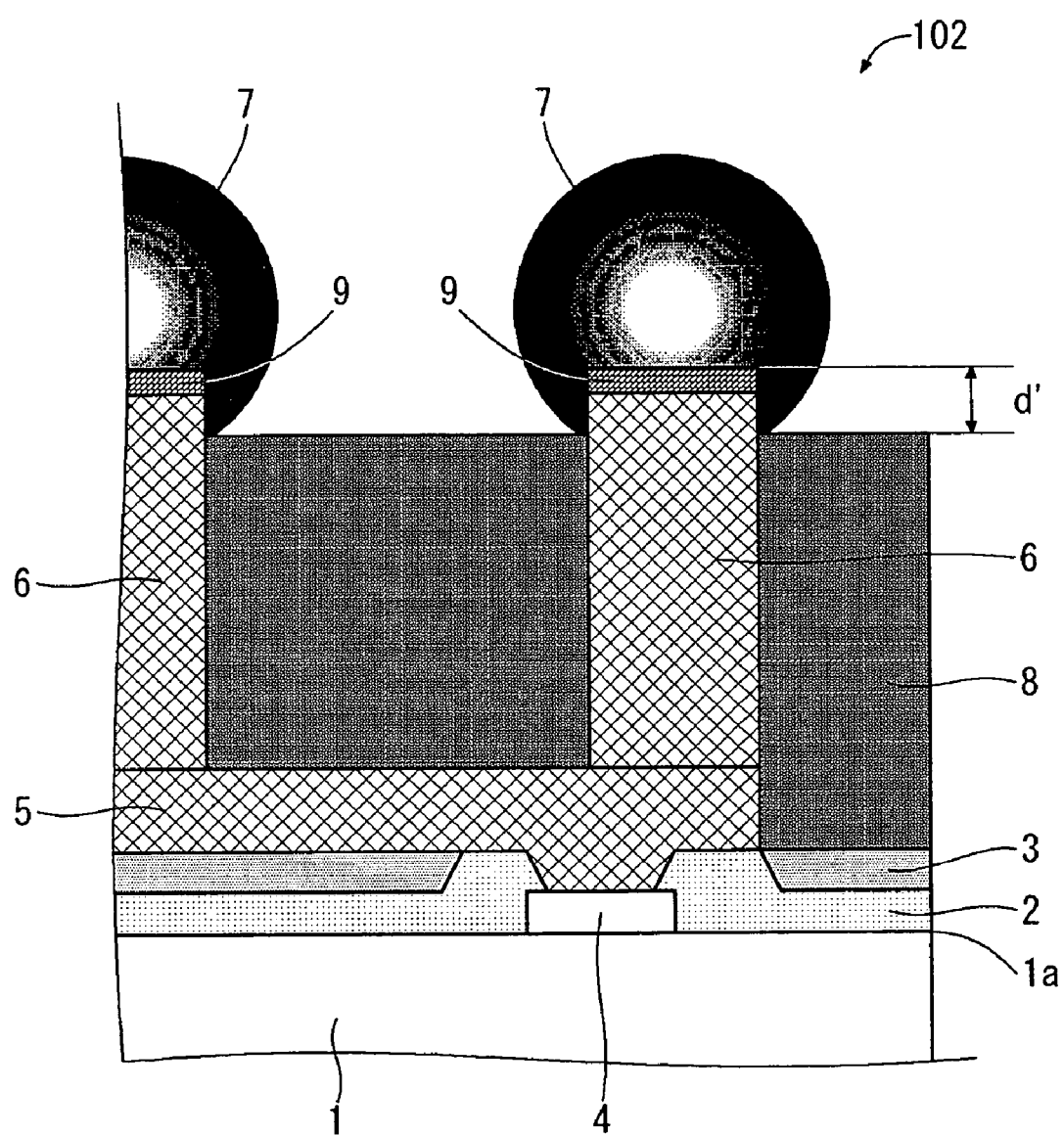
FIG. 4 is a cross-sectional diagram material view of a part of a structure of a resin-sealed type semiconductor device according to a second preferred embodiment of the present invention.

FIG. 4 is a view of a cross-sectional diagram of a part of a structure of a resin-sealed type semiconductor device 101. As shown in FIG. 4, the resin-sealed type semiconductor device 101 has the same or similar structure as that of the resin-sealed type semiconductor device 100 according to the first embodiment, with conductive layers 9 respectively formed on the top faces of the contact portions 6 being the primary distinguishing feature. The conductive layers 9 are, for example, nickel platings, and they are provided mainly to prevent diffusion of solders that are the material of the spherical electrodes 7. The film thickness of the nickel plating (i.e. the conductive layers 9) is, for example, 3 μm.

The sealing resin 8 is formed having a film thickness whose top is lower than the top faces of the conductive layers 9 by a predetermined amount 'd', in order to expose the top faces of the conductive layers 9 and parts of the sides of the contact portions 6 and the conductive layers 9. For example, this predetermined amount 'd' can be 10 to 13 μm or so.

In FIG. 4, with regard to the structure elements of the resin-sealed type semiconductor device 101 that are the same as those of the resin-sealed type semiconductor device 100 according to the first embodiment, the same reference numbers used in FIG. 1 are to be used and redundant description on the same structure will be omitted.

Manufacturing Method

Next, a manufacturing method of the resin-sealed type semiconductor device 101 according to the second embodiment of the present invention will be described.

In the method of manufacturing the resin-sealed type semiconductor device 101, the process of exposing the top faces and parts of the sides of the contact portions 6 by grinding up to the process of preparing the semiconductor wafer 1' whose electrical property has been estimated by wafer inspection are the same as or similar to the processes shown in FIGS. 2A to 3C with respect to the first embodiment of the present invention. Furthermore, in the second embodiment, a process of forming the conductive layers 9 on the top faces of the exposed contact portions 6 is performed after the process of exposing the top faces of the contact portions 6 by grinding the top face of the sealing resin 8 (shown in FIG. 3C).

Figure 5A:
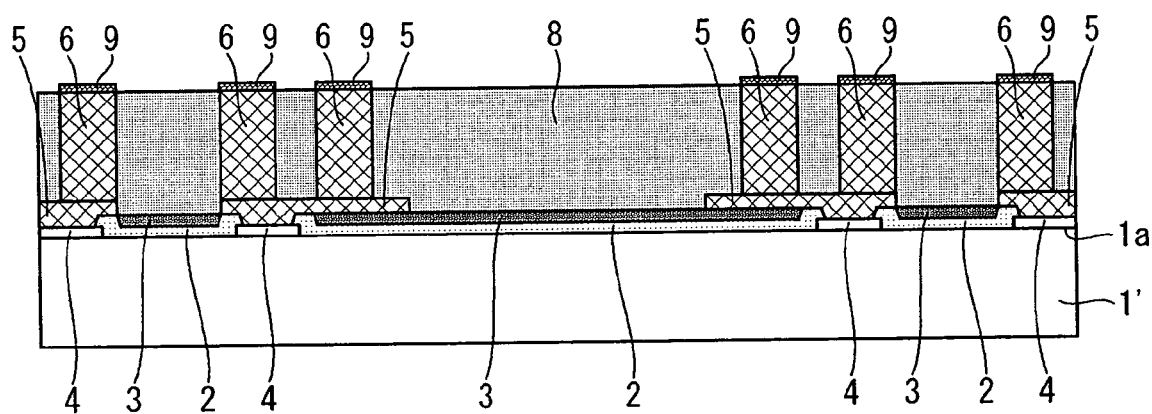
FIGS. 5A to 5D are cross-sectional views illustrating manufacturing processes of the resin-sealed type semiconductor device 101 according to the second embodiment of the present invention in simple manner.

In forming the conductive layers 9, as shown in FIG. 5A, the nickel platings are selectively formed on the top faces of the conductive layers 6 by non-electrolytic plating. The film thickness of the nickel plating is, for example, 3 μm as mentioned above. The nickel plating is formed for two purposes.

One purpose is to prevent diffusion of solders which are the material of the spherical electrodes 7. In the process of joining the contact portions 6 and the spherical electrodes 7 by melting, possible reaction between Cu which is the material of the contact portions 6 and Sn included in solder which is the material of the spherical electrodes 7 occurs, and thereby, intermetallic compounds that are hard and brashy may be generated. Thick intermetallic compounds may depress the entire reliability of the resin-sealed type semiconductor device 101 in the case of long-term use, particularly having a detrimental effect on the shockproof ability. Therefore, in this particular embodiment, the diffusion of solders is prevented by the conductive layers 9 that serve as barrier layers made of nickel, and the generation of intermetallic compounds is restrained.

The other purpose is to prevent over polishing of peripheral parts of the contact portions 6 in the blast processing to expose the side of the contact portions 6. Over polishing of the peripheral parts of the contact portions 6 may cause variation in the height of the spherical electrodes 7 and depress the mechanical strength. Therefore, in this particular embodiment, the conductive layers 9, which are hard barrier layers made of nickel, are formed, and the over polishing of the peripheral parts of the contact portions 6 is restrained.

Figure 5B:
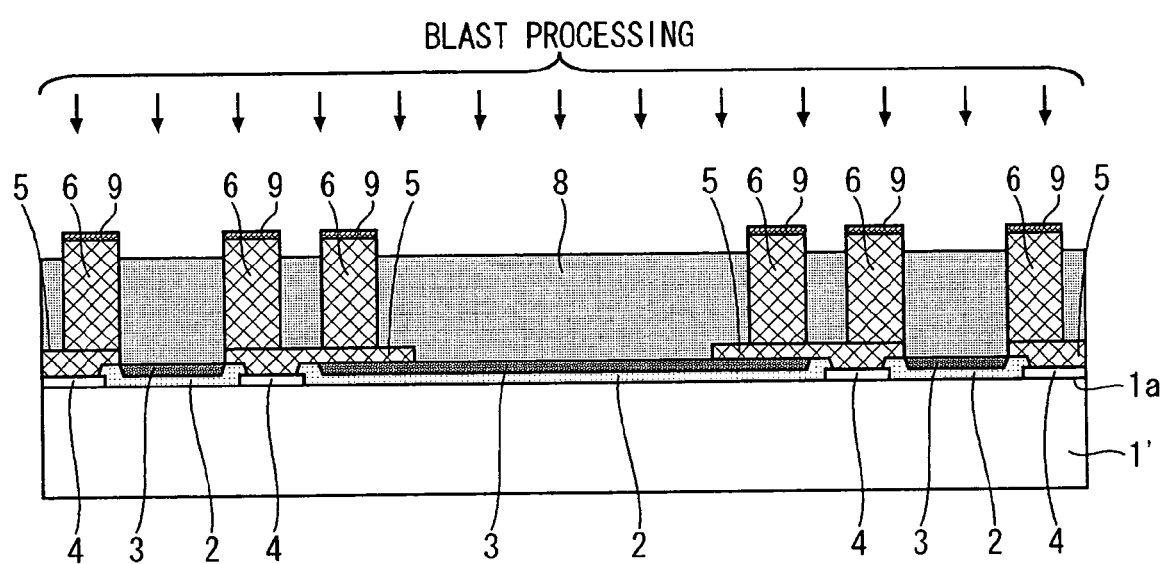

After the conductive layers 9 are formed, as shown in FIG. 5B, blast processing is performed on the top faces of the conductive layers 9 and the sealing resin 8. In this embodiment, as with the first embodiment, the liquid honing method is used for the blast processing. In this liquid honing method, a liquid mixture of abrasive grains and water (slurry) is blown off from a nozzle together with compressed air at a target, by which the target is physically polished. As for the conditions of the liquid honing process in this particular embodiment, polygon particles of alumina $(Al_2O_3)$ are used for the abrasive grains, and the process is performed twice with an air pressure of 0.25 MPa and at a processing speed of 10 mm/sec.

Figure 5C:
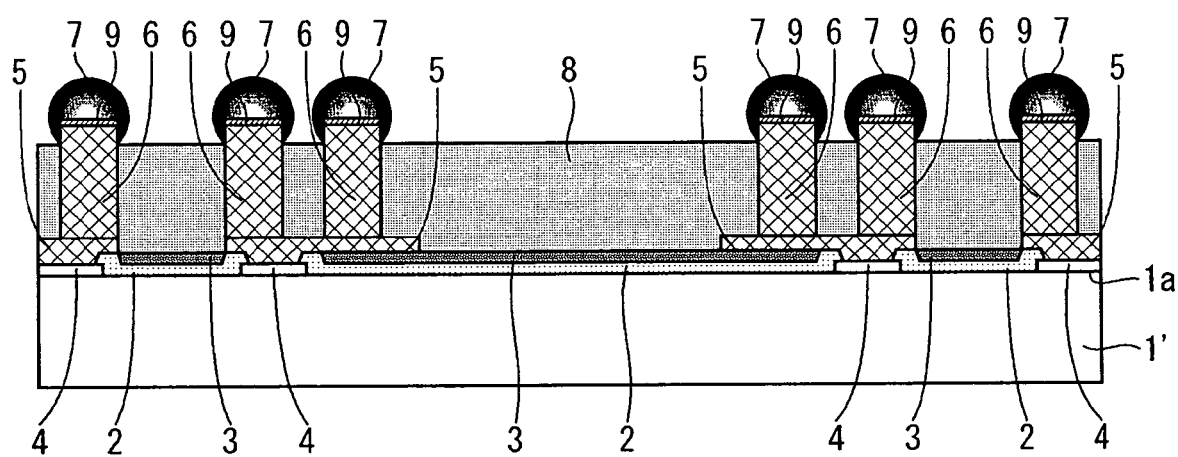

Next, as shown in FIG. 5C, the spherical electrodes 7 made of solders are respectively formed on the conductive layers 9. The spherical electrodes 7 are, for example, formed by ball mounting as with the first embodiment. The spherical electrodes 7 are formed so that they may be attached to the top faces of the conductive layers 9 and parts of the sides of the conductive layers 9 and the contact portions 6 that are exposed from the sealing resin 8.

Figure 5D:
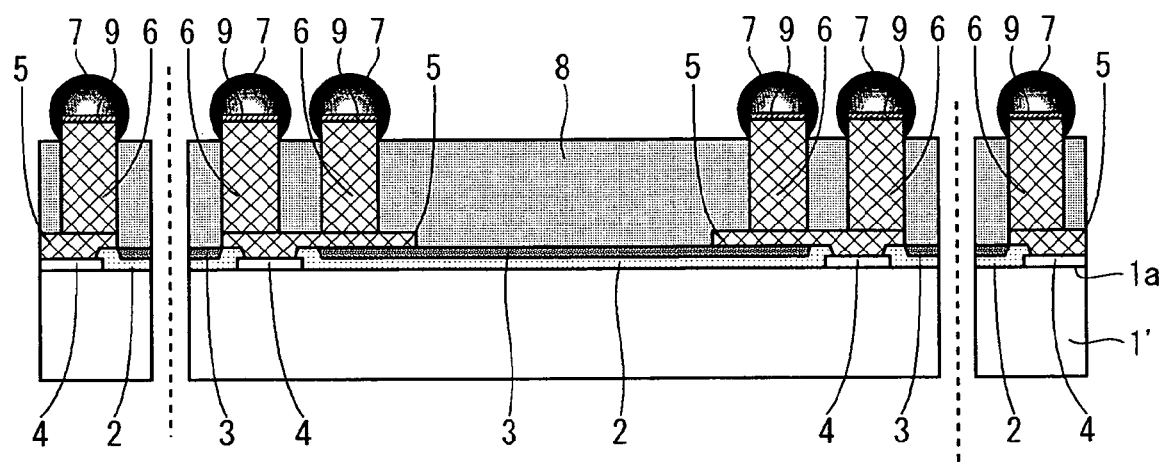

Finally, as shown in FIG. 5D, the semiconductor wafer 1' is divided into pieces by a dicing cutter such as a diamond cutter or the like, and the formation of the resin-sealed type semiconductor device 101 is completed.

In addition, although the present embodiment has been described as a resin-sealed type semiconductor device 101 of a BGA (ball grid array) type, as long as it is a semiconductor device with a structure having contact portions formed on a semiconductor chip and covered with a sealing resin, and whose external electrodes are formed on the contact portions, the present invention can be applied.

Operation Effect

According to the manufacturing method of a semiconductor device with respect to the second embodiment of the present invention, by forming the conductive layers 9 made of nickel on top of the contact portions 6, the over polishing of the peripheral parts of the contact portions 6 can be prevented while preventing the generation of intermetallic compounds. Therefore, further improvement on the connection reliability between the resin-sealed type semiconductor device 100 and the mounting substrate can be achieved in addition to the improvement achieved by the first embodiment.

This application claims priority to Japanese Patent Application No. 2004-262065. The entire disclosures of Japanese Patent Application No. 2004-262065 is hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

The term "configured" as used herein to describe a component, section or part of a device includes hardware and/or software that is constructed and/or programmed to carry out the desired function.

Moreover, terms that are expressed as "means-plus function" in the claims should include any structure that can be utilized to carry out the function of that part of the present invention.

The terms of degree such as "substantially," "about," and "approximately" as used herein mean a reasonable amount of deviation of the modified term such that the end result is not significantly changed. For example, these terms can be construed as including a deviation of at least±5% of the modified term if this deviation would not negate the meaning of the word it modifies.

What is claimed is:

1. A method of manufacturing a semiconductor device comprising:
   preparing a semiconductor wafer having electrode pads formed on a main surface;
   forming contact portions connecting to said electrode pads on said main surface;
   forming a sealing resin over said main surface;
   grinding a top face of said sealing resin to expose top faces of said contact portions;
   polishing said ground top face of said sealing resin by means of a liquid honing method to expose a side of said contact portions; and
   forming external terminals being connected to said contact portions exposed from said sealing resin.

2. The method of manufacturing a semiconductor device according to claim 1, wherein said liquid honing method includes ejecting a liquid mixture of abrasive grains and water from a nozzle together with compressed air, said abrasive grains include polygonal particles of alumina.

3. The method of manufacturing a semiconductor device according to claim 2, wherein ejecting a liquid mixture of abrasive grains and water is performed twice with an air pressure of 0.25 MPa at a processing speed of 10 mm/sec.

4. The method of manufacturing a semiconductor device according to claim 1, wherein polygon particles of alumina ($Al_2O_3$) are used as abrasive grains in said liquid honing process.

5. The method of manufacturing a semiconductor device according to claim 1, wherein said external terminals are spherical electrodes whose material includes solders.

6. The method of manufacturing a semiconductor device according to claim 1, further comprising, forming conductive layers on said contact portions after exposing said top faces of said contact portions.

7. The method of manufacturing a semiconductor device according to claim 6, wherein said conductive layers includes nickel.

8. The method of manufacturing a semiconductor device according to claim 7, wherein the external terminals are spherical electrodes of which material includes solders.

9. The method of manufacturing a semiconductor device according to claim 1, wherein a difference between a height of said top surface of said sealing resin and said top faces of said contact portions is 10 μm.

10. The method of manufacturing a semiconductor device according to claim 1, wherein a height of said contact portion is between 80 to 90 μm with a diameter of 250 μm.

11. The method of manufacturing a semiconductor device according to claim 10, wherein a difference between a height of said top surface of said sealing resin and said top faces of said contact portions is 10 μm.

12. The method of manufacturing a semiconductor device according to claim 11, further comprising, forming conductive layers on said contact portions after exposing said top faces of said contact portions.

13. The method of manufacturing a semiconductor device according to claim 12, wherein said conductive layers includes nickel.

14. The method of manufacturing a semiconductor device according to claim 13, wherein a thickness of said conductive layers is 3 μm.

15. A method of manufacturing a semiconductor device comprising:
   preparing a semiconductor wafer having electrode pads formed on a main surface;
   forming contact portions connecting to said electrode pads on said main surface;
   forming a sealing resin over said main surface;
   grinding a top face of said sealing resin to expose top faces of said contact portions so that the top faces of said contact portions are flat and so that said contact portions have substantially the same height;
   polishing said ground top face of said sealing resin by a liquid honing process to expose a side of said contact portions; and
   forming external terminals connected to said contact portions exposed from said sealing resin.

16. The method of manufacturing a semiconductor device according to claim 15, wherein said liquid honing method includes ejecting a liquid mixture of abrasive grains and water from a nozzle together with compressed air, said abrasive grains include polygonal particles of alumina.

17. The method of manufacturing a semiconductor device according to claim 16, wherein ejecting a liquid mixture of abrasive grains and water is performed twice with an air pressure of 0.25 MPa at a processing speed of 10 mm/sec.

18. The method of manufacturing a semiconductor device according to claim 15, wherein polygon particles of alumina ($Al_2O_3$) are used as abrasive grains in said liquid honing process.

19. The method of manufacturing a semiconductor device according to claim 15, further comprising, forming conductive layers on said contact portions after exposing said top faces of said contact portions.

20. The method of manufacturing a semiconductor device according to claim 15, wherein a difference between a height of said top surface of said sealing resin and said top faces of said contact portions is 10 μm.

* * * * *